(12) United States Patent
Lee et al.

(10) Patent No.: US 10,868,062 B2
(45) Date of Patent: Dec. 15, 2020

(54) SENSOR PACKAGE STRUCTURE

(71) Applicant: KINGPAK TECHNOLOGY INC., Hsin-Chu County (TW)

(72) Inventors: Chien-Chen Lee, Hsin-Chu County (TW); Chen-Pin Peng, Hsin-Chu County (TW); Chien-Heng Lin, Hsin-Chu County (TW); Jian-Ru Chen, Hsin-Chu County (TW)

(73) Assignee: KINGPAK TECHNOLOGY INC., Hsin-Chu County (TW)

( * ) Notice: Subject to any disclaimer, the term of this patent is extended or adjusted under 35 U.S.C. 154(b) by 0 days.

(21) Appl. No.: 16/508,431

(22) Filed: Jul. 11, 2019

(65) Prior Publication Data
US 2020/0105809 A1 Apr. 2, 2020

Related U.S. Application Data
(60) Provisional application No. 62/737,357, filed on Sep. 27, 2018.

(30) Foreign Application Priority Data

Apr. 17, 2019 (TW) .............................. 108113445 A

(51) Int. Cl.
*H01L 27/146* (2006.01)
*H01L 23/04* (2006.01)
*H01L 23/00* (2006.01)

(52) U.S. Cl.
CPC ........ *H01L 27/14618* (2013.01); *H01L 23/04* (2013.01); *H01L 24/16* (2013.01); *H01L 24/73* (2013.01); *H01L 27/14623* (2013.01); *H01L 27/14636* (2013.01); *H01L 2224/16225* (2013.01); *H01L 2224/48091* (2013.01); *H01L 2224/73204* (2013.01); *H01L 2924/15311* (2013.01); *H01L 2924/181* (2013.01); *H01L 2924/3025* (2013.01)

(58) Field of Classification Search
CPC . B81B 2201/02; H01L 25/065; H01L 25/105; H01L 27/14618; H01L 2924/181
See application file for complete search history.

(56) References Cited

U.S. PATENT DOCUMENTS

2017/0186886 A1* 6/2017 Weng ...................... G01S 7/481
2018/0012919 A1* 1/2018 Tu ......................... H01L 27/1469

* cited by examiner

Primary Examiner — Hsien Ming Lee
(74) Attorney, Agent, or Firm — Li & Cai Intellectual Property (USA) Office

(57) ABSTRACT

A sensor package structure includes a substrate, a sensor chip on the substrate, a ring-shaped support, a light permeable board on the ring-shaped support, and an opaque package body formed on the substrate. A top surface of the sensor chip includes a spacing region and a carrying region surrounding the spacing region. The support is disposed on the carrying region. The light permeable board has a ring-shaped notch recessed from an upper surface thereof, and the notch includes a platform surface at least partially located above the support and a wall surface connected to the platform surface and located above the spacing region. A portion of the opaque package body fills the notch and is defined as a light shielding portion. An inner lateral side of the support is arranged in a projection area formed by orthogonally projecting the platform surface onto the top surface.

7 Claims, 3 Drawing Sheets

SENSOR PACKAGE STRUCTURE

CROSS-REFERENCE TO RELATED PATENT APPLICATION

This application claims priority from the U.S. Provisional Patent Application Ser. No. 62/737,357 filed Sep. 27, 2018, which application is incorporated herein by reference in its entirety.

This application claims the benefit of priority to Taiwan Patent Application No. 108113445, filed on Apr. 17, 2019. The entire content of the above identified application is incorporated herein by reference.

FIELD OF THE DISCLOSURE

The present disclosure relates to a package structure, and more particularly to a sensor package structure.

BACKGROUND OF THE DISCLOSURE

A conventional package structure includes a sensor chip, a light permeable board, and a supporting layer sandwiched between the sensor chip and the light permeable board. A sensing region formed on the top surface of the sensor chip can receive external light passing through the light permeable board. However, some of the external light passing through the light permeable board is reflected by the supporting layer and induces a flare phenomenon, which can easily affect a sensing result of the sensing region.

SUMMARY OF THE DISCLOSURE

In response to the above-referenced technical inadequacies, the present disclosure provides a sensor package structure to effectively improve the glare issues associated with conventional sensor package structures.

In one aspect, the present disclosure provides a sensor package structure, which includes a substrate, a sensor chip, a ring-shaped support, a light permeable board, and an opaque package body. The sensor chip is disposed on the substrate and is electrically coupled to the substrate. A top surface of the sensor chip includes a sensing region, a spacing region surrounding the sensing region, and a carrying region surrounding the spacing region. The ring-shaped support is disposed on the carrying region of the sensor chip. The light permeable board has a first surface, a second surface opposite to the first surface, and an outer lateral side. The second surface of the light permeable board is disposed on the ring-shaped support. The light permeable board, the ring-shaped support, and the top surface of the sensor chip jointly surround to form an enclosed space. A ring-shaped notch is recessed from the first surface of the light permeable board, and includes a platform surface and a wall surface that connects with the platform surface. The platform surface is at least partially arranged above the ring-shaped support, the wall surface is arranged above the spacing region, and the outer lateral side of the light permeable board is arranged between the second surface and the platform surface. The opaque package body is formed on the substrate. The opaque package body connects with the outer lateral side of the light permeable board and the ring-shaped support, and a part of the opaque package body is filled into the ring-shaped notch and is defined as a light shielding portion. The opaque package body covers the platform surface, the first surface is at least partially exposed from the opaque package body, and an inner lateral side of the ring-shaped support is arranged in a projection area formed by orthogonally projecting the platform surface onto the top surface of the sensor chip.

Therefore, the sensor package structures of the present disclosure are constructed through collocating the light permeable board and the opaque package body (e.g., the first surface is at least partially exposed from the opaque package body, and the inner lateral side of the ring-shaped support is arranged in a projection area formed by orthogonally projecting the platform surface onto the top surface of the sensor chip), the extent the external light signal is reflected by the ring-shaped support after passing through the light permeable board is mitigated, so that the image sensing quality of the sensor chip is improved.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

First Embodiment

Figure 1:
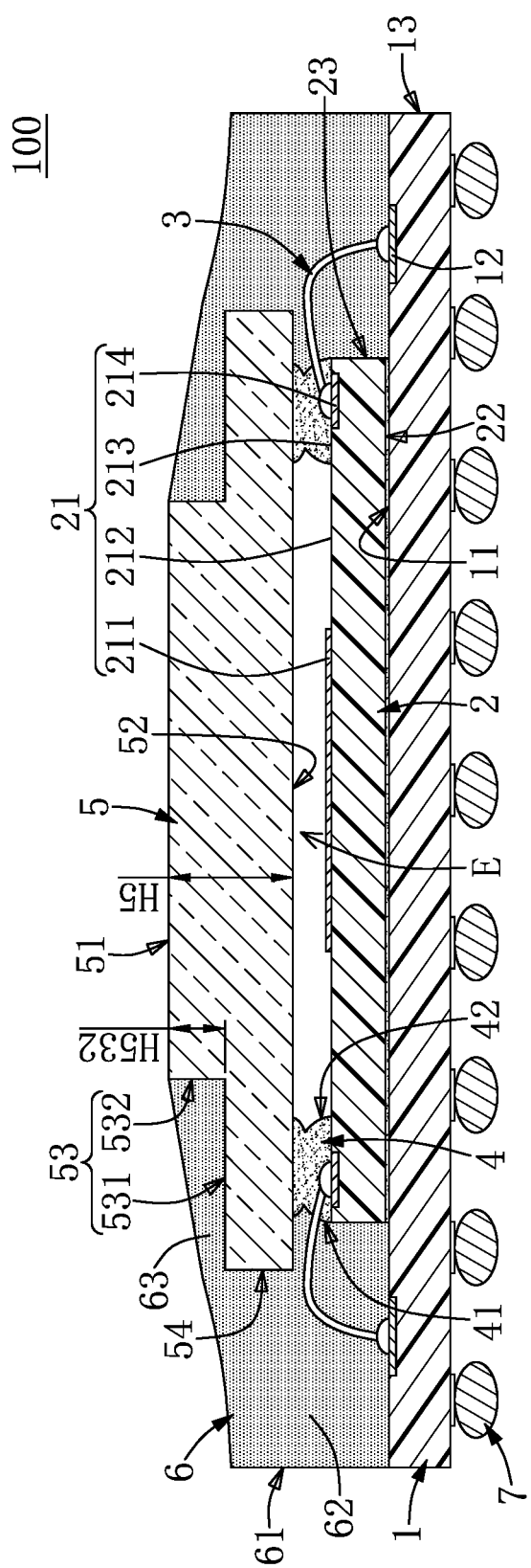
FIG. 1 is a cross-sectional view of a sensor package structure according to a first embodiment of the present disclosure.

Referring to FIG. 1, a first embodiment of the present disclosure provides a sensor package structure 100. The sensor package structure 100 includes a substrate 1, a sensor chip 2 disposed on the substrate 1, a plurality of metal wires 3 electrically coupling the substrate 1 and the sensor chip 2, a ring-shaped support 4 disposed on the sensor chip 2, a light permeable board 5 disposed on the ring-shaped support 4, an opaque package body 6 formed on the substrate 1, and a plurality of solder balls 7 disposed on a bottom surface of the substrate 1.

It should be noted that the drawings of the present embodiment are cross-sectional views for the sake of easily describing the sensor package structure 100 of the present embodiment, and portions of the sensor package structure 100 not shown in the drawings shall have corresponding structures. For example, FIG. 1 shows only two of the metal wires 3 and one row of the solder balls 7, but portions of the sensor package structure 100 not shown in FIG. 1 include other metal wires 3 and other solder balls 7. The structure and connection relationship of each component of the sensor package structure 100 will be recited in the following context.

The substrate 1 of the present embodiment is in a square shape or a rectangular shape. A top surface of the substrate 1 includes a chip-bonding region 11 arranged on a substantially center portion thereof, and the substrate 1 includes a plurality of first pads 12 which are disposed on the top surface and at periphery of the chip-bonding region 11. Moreover, the substrate 1 is further provided with the solder balls 7 disposed on the bottom surface thereof. The substrate 1 can be soldered onto an electronic component (e.g., a printed circuit board) through the solder balls 7, thereby electrically connecting the sensor package structure 100 to the electronic component.

The sensor chip 2 in the present embodiment is an image sensing chip, but the present disclosure is not limited thereto. The sensor chip 2 includes a top surface 21, a bottom surface 22 opposite to the top surface 21, and an outer lateral side 23 connecting edges of the top surface 21 and the bottom surface 22. The bottom surface 22 of the sensor chip 2 is disposed on the chip-bonding region 11 of the substrate 1, and the sensor chip 2 is electrically coupled to the substrate 1. The top surface 21 of the sensor chip 2 has a sensing region 211, a spacing region 212 surrounding the sensing region 211, and a carrying region 213 surrounding the spacing region 212. The sensor chip 2 includes a plurality of second pads 214 which are disposed on the carrying region 213, and the number and positions of the second pads 214 correspond to those of the first pads 12.

Each of the metal wires 3 has a first end and an opposite second end, the first ends of the metal wires 3 are respectively connected to the first pads 12 of the substrate 1, and the second ends of the metal wires 3 are respectively connected to the second pads 214 of the sensor chip 2, so that the substrate 1 and the sensor chip 2 can be electrically connected to each other through the metal wires 3.

The ring-shaped support 4 is disposed on the carrying region 213 of the sensor chip 2, and the ring-shaped support 4 in the present embodiment covers each of the second pads 214 and a portion of the metal wire 3 connected to the associated second pad 214. Moreover, the ring-shaped support 4 in the present embodiment is an adhesive. Along a horizontal direction of FIG. 1, an outer diameter of the ring-shaped support 4 is substantially equal to that of the sensor chip 2. In other words, an outer lateral side 41 of the ring-shaped support 4 in the present embodiment is substantially flush with the outer lateral side 23 of the sensor chip 2, but the present disclosure is not limited thereto.

The light permeable board 5 includes a first surface 51 and a second surface that is opposite to the first surface 51. The second surface 52 of the light permeable board 5 is disposed on the ring-shaped support 4 (i.e., the ring-shaped support 4 is sandwiched between the top surface 21 of the sensor chip 2 and the second surface 52 of the light permeable board 5), so that the light permeable board 5, the ring-shaped support 4, and the top surface 21 of the sensor chip 2 jointly surround and form an enclosed space E.

In the present embodiment, the light permeable board 5 is a transparent glass board. Along the horizontal direction of FIG. 1, an outer diameter of the light permeable board 5 is larger than that of the sensor chip 2, but the present disclosure is not limited thereto. For example, in other embodiments not shown in the present disclosure, the outer diameter of the light permeable board 5 can be less than that of the sensor chip 2.

Moreover, a ring-shaped notch 53 is recessed from the first surface 51 of the light permeable board 5, and the notch 53 includes a platform surface 531 and a wall surface 532 that connects with the platform surface 531. The wall surface 532 in the present embodiment perpendicularly connects the platform surface 531 and the first surface 51. The light permeable board 5 includes an outer lateral side 54 perpendicularly connecting the second surface 52 and the platform surface 531. It should be noted that an angle between any two of the first surface 51, the platform surface 531, the wall surface 532, and the outer lateral side 54 of the light permeable board 5 can be adjusted or changed according to design requirements.

The opaque package body 6 is in a ring-shape, and it connects the outer lateral side 54 of the light permeable board 5 and the ring-shaped support 4. The opaque package body 6 in the present embodiment covers and surrounds the outer lateral side 23 of the sensor chip 2 and the outer lateral side 41 of the ring-shaped support 4. A part of the opaque package body 6 is filled into the ring-shaped notch 53 and covers the platform surface 531. An outer lateral side 61 of the opaque package body 6 in the present embodiment is coplanar with an outer lateral side 13 of the substrate 1. Moreover, the first surface 51 of the light permeable board 5 is at least partially exposed from the opaque package body 6. In the present embodiment, the first surface 51 of the light permeable board 5 is entirely exposed from the opaque package body 6.

Specifically, the opaque package body 6 includes a main portion 62 and a light shielding portion 63. The main portion 62 is integrally connected to the light shielding portion 63. The main portion 62 covers the outer lateral side 41 of the ring-shaped support 4, the outer lateral side 54 of the light permeable board 5, and the outer lateral side 23 of the sensor chip 2. A portion of each of the metal wires 3 is embedded in the ring-shaped support 4, and the other portion of each of the metal wires 3 is embedded in the main portion 62.

Moreover, the light shielding portion 63 is filled in the ring-shaped notch 53. The light shielding portion 63 covers at least part of the platform surface 531 and/or at least part of the wall surface 532). In the present embodiment, the light shielding portion 63 of the opaque package body 6 covers the platform surface 531 and the wall surface 532, entirely, and an inner lateral side 42 of the ring-shaped support 4 is arranged in a projection area formed by orthogonally projecting the platform surface 531 onto the top surface 21 of the sensor chip 2.

Second Embodiment

Figure 2:
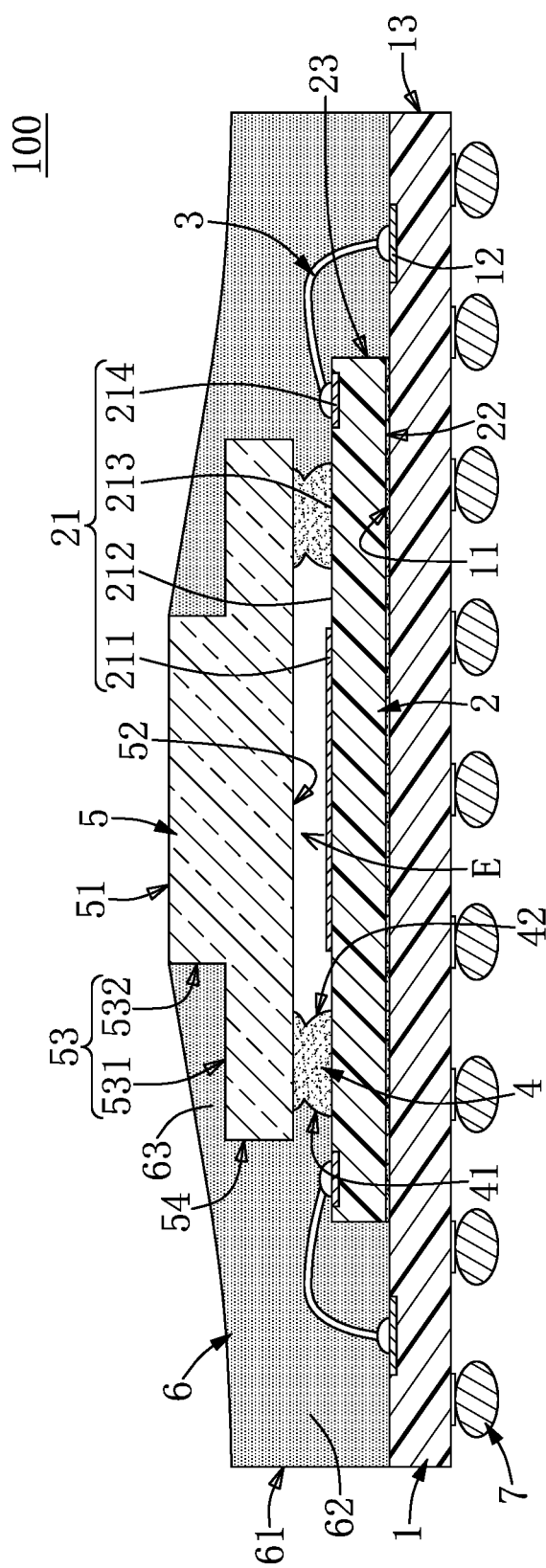
FIG. 2 is a cross-sectional view of a sensor package structure according to a second embodiment of the present disclosure.

As shown in FIG. 2, a second embodiment of the present disclosure is provided. The present embodiment is similar to the first embodiment, so identical parts shall not be recited again. The differences between the present and the first embodiment will be described in the following.

Along the horizontal direction of FIG. 2 of the present embodiment, an outer diameter of the light permeable board 5 is less than that of the sensor chip 2. Moreover, the second pads 214 of the sensor chip 2 are arranged outside of the ring-shaped support 4, so that the metal wires 4 are arranged outside of the ring-shaped support 4 and are entirely embedded in the main portion 62 of the opaque package body 6. According to the first and second embodiments, each of the metal wires 4 of the present disclosure can be at least partially embedded in the main portion 62 of the opaque package body 6.

Third Embodiment

Figure 3:
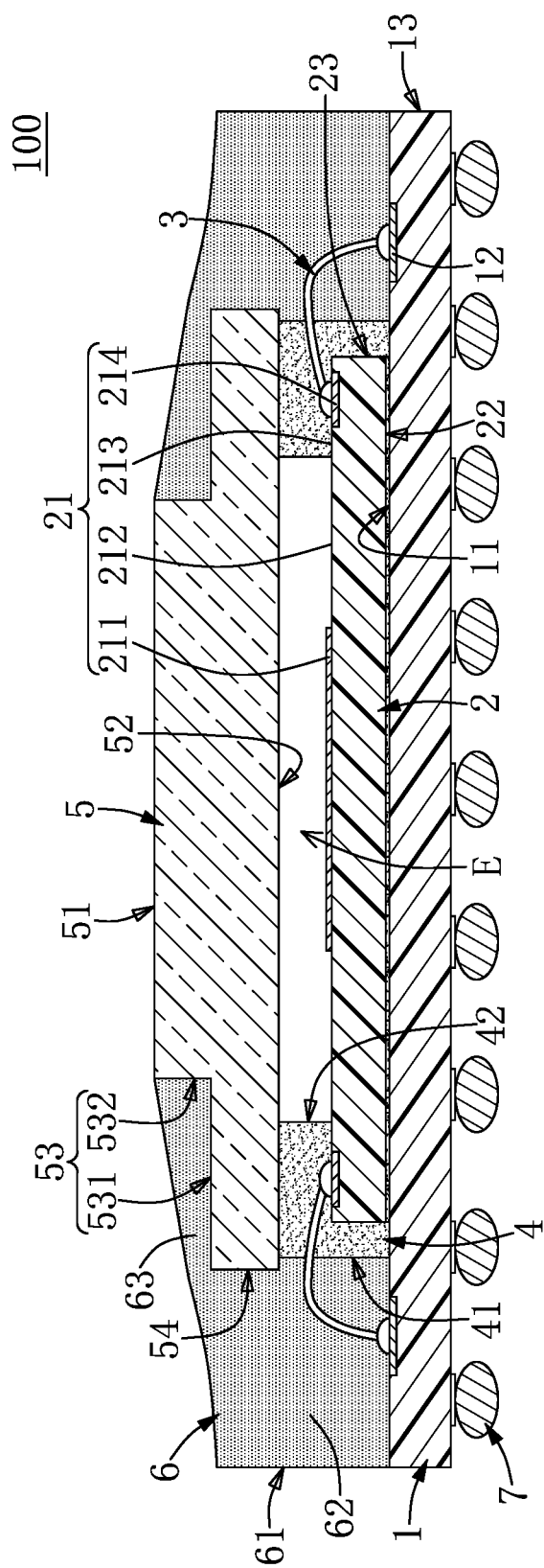
FIG. 3 is a cross-sectional view of a sensor package structure according to a third embodiment of the present disclosure.

As shown in FIG. 3, a third embodiment of the present disclosure is provided. The present embodiment is similar to the first embodiment, so identical parts shall not be recited again. The differences between the present and the first embodiment will be described in the following.

In the present embodiment, the volume of the ring-shaped support 4 is increased to embed a portion of each of the metal wires 3 and further cover the outer lateral side 23 of the sensor chip 2, and the other portion of each of the metal wires 3 is embedded in the main portion 62 of the opaque package body 6.

In conclusion, the sensor package structures of the present disclosure are constructed through collocating the light permeable board and the opaque package body (e.g., the first surface is at least partially exposed from the opaque package body, and the inner lateral side of the ring-shaped support is arranged in a projection area formed by orthogonally projecting the platform surface onto the top surface of the sensor chip), the extent the external light signal is reflected by the ring-shaped support after passing through the light permeable board is mitigated, so that the image sensing quality of the sensor chip is improved.

Moreover, in any of the sensor package structures of the present disclosure, limitations of fine structure characteristics may be imposed on the light permeable board and the opaque package body, thus the extent that external light signal is reflected by the ring-shaped support after passing through the light permeable board is accordingly reduced.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A sensor package structure, comprising:
   a substrate;
   a sensor chip disposed on the substrate and electrically coupled to the substrate, wherein a top surface of the sensor chip includes a sensing region, a spacing region surrounding the sensing region, and a carrying region surrounding the spacing region;
   a ring-shaped support disposed on the carrying region of the sensor chip;
   a light permeable board having a first surface, a second surface opposite to the first surface, and an outer lateral side, wherein the second surface of the light permeable board is disposed on the ring-shaped support, and the light permeable board, the ring-shaped support, and the top surface of the sensor chip jointly surround and form an enclosed space, wherein a ring-shaped notch recessed from the first surface of the light permeable board includes a platform surface and a wall surface that connects with the platform surface, and wherein the platform surface is at least partially arranged above the ring-shaped support, the wall surface is arranged above the spacing region, and the outer lateral side of the light permeable board is arranged between the second surface and the platform surface; and
   an opaque package body formed on the substrate, wherein the opaque package body contacts the outer lateral side of the light permeable board and the ring-shaped support, and a part of the opaque package body is filled into the ring-shaped notch and is defined as a light shielding portion, and wherein the opaque package body covers the platform surface, the first surface is at least partially exposed from the opaque package body, and an inner lateral side of the ring-shaped support is arranged in a projection area formed by orthogonally projecting the platform surface onto the top surface of the sensor chip.

2. The sensor package structure according to claim 1, wherein the light shielding portion of the opaque package body covers the entire platform surface and the entire wall surface, and the first surface is entirely exposed from the opaque package body.

3. The sensor package structure according to claim 1, wherein the outer lateral side of the light permeable board connects the second surface and the platform surface, and the wall surface is perpendicularly connected to the platform surface and the first surface.

4. The sensor package structure according to claim 1, further comprising a plurality of metal wires, wherein the sensor chip is electrically coupled to the substrate through the metal wires, and wherein the opaque package body includes a main portion connected to the light shielding portion, the main portion covers an outer lateral side of the ring-shaped support and the outer lateral side of the light permeable board, and each of the metal wires is at least partially embedded in the main portion.

5. The sensor package structure according to claim 4, wherein the metal wires are arranged outside of the ring-shaped support and are entirely embedded in the main portion of the opaque package body, and the main portion further covers an outer lateral side of the sensor chip.

6. The sensor package structure according to claim 4, wherein a portion of each of the metal wires is embedded in the ring-shaped support, and the other portion of each of the metal wires is embedded in the main portion, and wherein the main portion further covers an outer lateral side of the sensor chip.

7. The sensor package structure according to claim 4, wherein a portion of each of the metal wires is embedded in the ring-shaped support, and the other portion of each of the metal wires is embedded in the main portion, and wherein the ring-shaped support covers an outer lateral side of the sensor chip.

* * * * *